(12) United States Patent
Yoo et al.

(10) Patent No.: US 7,202,500 B2
(45) Date of Patent: Apr. 10, 2007

(54) THIN FILM TRANSISTOR ARRAY SUBSTRATE AND METHOD OF MANUFACTURING THE SAME

(75) Inventors: Soon Sung Yoo, Kyounggi-do (KR); Heung Lyul Cho, Kyounggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 80 days.

(21) Appl. No.: 10/958,264

(22) Filed: Oct. 6, 2004

(65) Prior Publication Data

US 2005/0077521 A1    Apr. 14, 2005

(30) Foreign Application Priority Data

Oct. 10, 2003  (KR)  .................. 10-2003-0070701

(51) Int. Cl.
*H01L 29/04*    (2006.01)
(52) U.S. Cl. .................. 257/72; 257/66; 257/59; 257/E29.151; 257/E51.005; 438/128; 438/149
(58) Field of Classification Search .................. None
See application file for complete search history.

(56) References Cited

U.S. PATENT DOCUMENTS 6,882,376 B2 *    4/2005    Kim et al. .................. 349/43

* cited by examiner

*Primary Examiner*—Thomas Dickey
*Assistant Examiner*—Scott R. Wilson
(74) *Attorney, Agent, or Firm*—Morgan, Lewis & Bockius, LLP

(57) ABSTRACT

A thin film transistor array substrate includes a gate pattern on a substrate. The gate pattern includes a gate electrode, a gate line connected to the gate electrode, and a lower gate pad electrode connected to the gate line. A source/drain pattern includes a source electrode and a drain electrode, a data line connected to the source electrode, and a lower data pad electrode connected to the data line. A semiconductor pattern is formed beneath the source/drain pattern. A transparent electrode pattern includes a pixel electrode connected to the drain electrode, an upper gate pad electrode connected to the lower gate pad electrode, and an upper data pad electrode connected to the lower data pad electrode. The thin film array substrate further includes a gate insulating pattern and a passivation film pattern stacked at remaining areas excluding areas within which the transparent electrode pattern is formed.

5 Claims, 23 Drawing Sheets

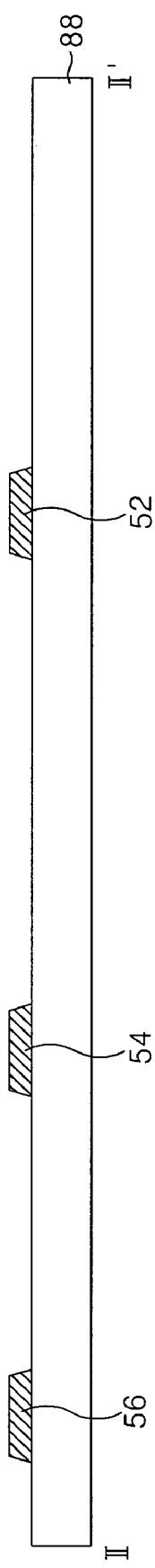

US 7,202,500 B2

THIN FILM TRANSISTOR ARRAY SUBSTRATE AND METHOD OF MANUFACTURING THE SAME

The present invention claims the benefit of Korean Patent Application No. P2003-70701 filed in Korea on Oct. 10, 2003, which is hereby incorporated by reference.

BACKGROUND OF THE INVENTION

1. Field of the Invention

The present invention relates to a liquid crystal display (LCD) device, and more particularly, to a thin film transistor array substrate and a method of manufacturing the same.

2. Description of the Related Art

In general, a liquid crystal display device outputs an image by adjusting a transmittance of a liquid crystal material with an applied electric field. For this purpose, the liquid crystal display device includes a liquid crystal display panel in which liquid crystal cells are arranged in a matrix pattern, and a driving circuit for driving the liquid crystal display panel. Specifically, the liquid crystal display panel includes a thin film transistor array substrate and a color filter array substrate facing each other, a spacer for maintaining a cell gap between the array substrates, and a liquid crystal injected within the cell gap. The color filter array substrate includes a color filter including liquid crystal cells, a black matrix reflecting external light and separating the color filters, a common electrode supplying a reference voltage to the liquid crystal cells, and an alignment film applied on the liquid crystal cells.

The thin film transistor array substrate includes gate lines and data lines. Thin film transistors are formed as switching devices at every crossing of the gate lines and the data lines. Pixel electrodes are respectively connected to the formed thin film transistors. An alignment film is applied on the liquid crystal cells. The gate lines and the data lines receive signals from the driving circuits through each of a plurality of pad parts. Each thin film transistor supplies a pixel voltage signal to the pixel electrode in response to a scan signal provided through a gate line. The pixel voltage signal is provided through a data line.

The liquid crystal display panel is fabricated by combining the thin film transistor array substrate and the color filter array substrate, which are separately manufactured. The liquid crystal material is injected between the substrates. The substrates are then sealed with the liquid crystal material between them. When fabricating such a liquid crystal display device, since the thin film transistor array substrate involves a semiconductor process and requires a plurality of mask processes, the manufacturing process for the thin film transistor array substrate is complicated and causes high manufacturing cost for the liquid crystal display panel.

In order to reduce manufacturing cost, a reduction in the number of mask processes is sought. Because, each mask process includes many processes, such as thin film deposition, cleaning, photolithography, etching, photo-resist stripping, inspection processes and the like. Recently, a four mask process has been introduced. The four mask process is obtained from an existing five mask process, which is commonly used.

FIG. 1 is a plan view illustrating a portion of a thin film transistor array substrate in accordance with related art. FIG. 2 is a sectional view of the related art thin film transistor array substrate taken along the line I–I' in FIG. 1. Referring to FIGS. 1 and 2, the thin film transistor array substrate includes gate lines 2 and data lines 4 crossing each other. A gate insulating film 44 is disposed on a lower substrate 42 between the gate lines 2 and the data lines 4. A thin film transistor 6 is formed at each crossing of the gate lines and the data lines. A pixel electrode 18 is formed in the cell region defined by the crossings of the gate lines and data lines. The thin film transistor array substrate further includes a storage capacitor 20, a gate pad part 26 and a data pad part 34. The storage capacitor 20 is formed at an overlapped part of the pixel electrode 18 and a pre-stage gate line 2. The gate pad part 26 is connected to the gate line 2. The data pad part 34 is connected to the data line 4.

The thin film transistor 6 includes a gate electrode 8, a source electrode 10, a drain electrode 12, and an active layer 14 of a semiconductor pattern 47. The gate electrode 8 is connected to the gate line 2. The source electrode 10 is connected to the data line 4. The drain electrode 12 is connected to a pixel electrode 18. The active layer 14 of semiconductor pattern 47 has a channel region defined between the source electrode 10 and the drain electrode 12, and overlaps the gate electrode 8.

The active layer 14 is overlapped by a lower data pad electrode 36, a storage electrode 22, the data line 4, the source electrode 10 and the drain electrode 12. An ohmic contact layer 48 is formed on the active layer 14. The ohmic contact layer 48 of the semiconductor pattern 47 contacts the lower data pad electrode 36, the storage electrode 22, the data line 4, the source electrode 10, the drain electrode 12. The thin film transistor 6, in response to the gate signal supplied to the gate line 2, charges and maintains a pixel voltage signal, which is supplied through the data line 4, in the pixel electrode 18.

The pixel electrode 18 is connected to the drain electrode 12 of the thin film transistor 6 via a first contact hole 16 passing through a passivation film 50. The pixel voltage charged across the pixel electrode 18 causes a potential difference with respect to the common electrode formed on an upper substrate (not shown). The liquid crystal material located between the thin film transistor substrate and the upper substrate rotates under the influence of this potential difference, due to a dielectric anisotropy. The rotated crystal material transmits incident light emitted by the light source (not shown) to the upper substrate through the pixel electrode 18.

The storage capacitor 20 includes a pre-stage gate line 2, a storage electrode 22, and the pixel electrode 18. The storage electrode 22 overlaps the pre-stage gate line 2 with the gate insulating film 44, the active layer 14 and the ohmic contact layer 48 therebetween. The pixel electrode 18 is connected through a second contact hole 24 formed at the passivation film 50 and overlaps the storage electrode 22 having the passivation film 50 therebetween. The storage capacitor 20 charges the pixel voltage to the pixel electrode 18 and maintains a stable voltage until a next pixel voltage is charged.

The gate line 2 is connected to a gate driver (not shown) through the gate pad part 26. The gate pad part 26 includes a lower gate pad electrode 28 and an upper gate pad electrode 32. The lower gate pad electrode 28 extends from the gate line 2. The upper gate pad electrode 32 is connected to the lower gate pad electrode 28 via a third contact hole 30, which passes through both of the gate insulating film 44 and the passivation film 50.

The data line 4 is connected to a data driver (not shown) through the data pad part 34. The data pad part 34 includes the lower data pad electrode 36 and an upper data pad electrode 40. The lower data pad electrode 36 extends from the data line 4. The upper data pad electrode 40 is connected to the lower data pad electrode 36 via a fourth contact hole 38 passing through the passivation film 50. The thin film transistor substrate having the above-mentioned configuration is formed through the use of the four mask process.

FIGS. 3A to 3D are sectional views sequentially illustrating a method of manufacturing the related art thin film transistor array substrate shown in FIG. 2. Referring to FIG. 3A, gate patterns are formed on the lower substrate 42. A gate metal layer is formed on the lower substrate 42 by a deposition method, such as sputtering. The gate metal layer is subsequently patterned by a photolithography process using a first mask and an etching process to thereby form the gate patterns, which include the gate line 2, the gate electrode 8 and the lower gate pad electrode 28. A material for the gate metal layer includes chrome (Cr), molybdenum (Mo), aluminium (Al) or the like, which are used in a form of a single-layer structure or a double-layer structure.

Referring to FIG. 3B, the gate insulating film 44, the active layer 14, the ohmic contact layer 48 and source/drain patterns are sequentially formed on the lower substrate 42 provided with the gate pattern. The gate insulating film 44, an amorphous silicon layer, a n+ amorphous silicon layer and a source/drain metal layer are sequentially formed on the lower substrate 42 having the gate patterns thereon by a deposition technique, such as plasma enhanced chemical vapor deposition (PECVD) and sputtering.

A photo-resist pattern is formed on the source/drain metal layer by a photolithography process using a second mask. In this case, the second mask is a diffractive exposure mask having a diffractive exposing part wherein the diffractive exposing part corresponds to a channel portion of the thin film transistor. The resulting photo-resist pattern of the channel portion has a lower height than a photo-resist pattern of the source/drain pattern part.

The source/drain metal layer is subsequently patterned by a wet etching process using the photo-resist pattern, thereby forming source/drain patterns including the data line 4, the source electrode 10, the drain electrode 12 being integral to the source electrode 10 and the storage electrode 22.

Next, the amorphous silicon layer and the n+ amorphous silicon layer are simultaneously patterned by a dry etching process using the same photo-resist pattern. The resulting semiconductor pattern 47 includes the ohmic contact layer 48 and the active layer 14. The photo-resist pattern having a relatively low height in the channel portion is removed by an ashing process and thereafter the source/drain pattern and the ohmic contact layer 48 of the channel portion are etched by a dry etching process. Accordingly, the active layer 14 of the channel portion is exposed to separate the source electrode 10 from the drain electrode 12. Thereafter, a remainder of the photo-resist pattern left on the source/drain pattern is removed by a stripping process.

Referring to FIG. 3C, the passivation film 50 is formed on the gate insulating film 44 including the source/drain patterns. The passivation film 50 includes first to fourth contact holes 16, 24, 30 and 38. A metal for the source/drain pattern includes chrome (Cr), titanium (Ti), tantalum (Ta) or the like. The passivation film 50 is entirely formed on the gate insulating film 44 having the source/drain patterns by a deposition technique, such as PECVD.

The passivation film 50 is subsequently patterned by photolithography using a third mask and an etching process to thereby form the first to fourth contact holes 16, 24, 30 and 38. The first contact hole 16 passes through the passivation film 50 and exposes the drain electrode 12. The second contact hole 24 passes through the passivation film 50 and exposes the storage electrode 22. The third contact hole 30 passes through the passivation film 50 and the gate insulating film 44 and exposes the lower gate pad electrode 28. The fourth contact hole 38 passes through the passivation film 50 and exposes the lower data pad electrode 36.

The gate insulating film 44 is made of an inorganic insulating material, such as silicon oxide ($SiO_x$) or silicon nitride ($SiN_x$). The passivation film 50 is made of an inorganic insulating material, like the gate insulating film 44, or an organic insulating material having a small dielectric constant, such as an acrylic organic compound, BCB (benzocyclobutene) or PFCB (perfluorocyclobutane).

Referring to FIG. 3D, transparent electrode patterns are formed on the passivation film 50. More specifically, a transparent electrode material is entirely deposited on the passivation film 50 by a deposition technique, such as sputtering or the like. Then, the transparent electrode material is patterned by photolithography using a fourth mask and an etching process. The resulting transparent electrode patterns includes the pixel electrode 18, the upper gate pad electrode 32 and the upper data pad electrode 40. The pixel electrode 18 is electrically connected, via the first contact hole 16, to the drain electrode 12 while being electrically connected, via the second contact hole 24, to the storage electrode 22 overlapping a pre-stage gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36. In this connection, the transparent electrode material is made of an indium-tin-oxide (ITO), a tin-oxide (TO) or an indium-zinc-oxide (IZO).

As described above, the related art thin film transistor array substrate and the manufacturing method thereof adopts a four mask process. The four mask process simplifies the manufacturing processes compared with the five mask process and reduces manufacturing cost accordingly. However, since the four mask process is still complex and provides only limited reduction in manufacturing cost, a simpler manufacturing process with further reduction in manufacturing cost is needed.

SUMMARY OF THE INVENTION

Accordingly, the present invention is directed to a thin film transistor array substrate and a method of manufacturing the same that substantially obviate one or more of the problems due to limitations and disadvantages of the related art.

An object of the present invention is to provide a thin film transistor array substrate having a simplified structure.

Another object of the present invention is to provide a simple method of manufacturing a thin film transistor array substrate with a simplified structure.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, the thin film transistor array substrate includes a gate pattern on a substrate. The gate pattern includes a gate electrode of a thin film transistor, a gate line connected to the gate electrode, and a lower gate pad electrode connected to the gate line. A source/drain pattern of the thin film transistor array substrate includes a source electrode and a drain electrode, a data line connected to the source electrode, and a lower data pad electrode connected to the data line. A semiconductor pattern is formed beneath the source/drain pattern. A transparent electrode pattern of the thin film transistor array substrate includes a pixel electrode connected to the drain electrode, an upper gate pad electrode connected to the lower gate pad electrode, and an upper data pad electrode connected to the lower data pad electrode. The thin film array substrate further includes a gate insulating pattern and a passivation film pattern stacked at remaining areas excluding areas within which the transparent electrode pattern is formed. The source/drain pattern is exposed by the passivation film pattern and a lateral surface of the source/drain pattern is further inclined, downward and outward, than the passivation film pattern.

In another aspect, the method of manufacturing a thin film transistor array substrate includes forming a gate pattern on a substrate, the gate pattern including a gate electrode of a thin film transistor, a gate line connected to the gate electrode, a lower gate pad electrode connected to the gate line; forming a gate insulating film on the substrate to cover the gate pattern thereon and an exposed portion of the substrate; forming a semiconductor pattern and a source/drain pattern over the semiconductor pattern, the source/drain pattern including a source electrode and a drain electrode of the thin film transistor, a data line connected to the source electrode and a lower data pad electrode connected to the data line; forming a transparent electrode pattern, a passivation film pattern and a gate insulation pattern, wherein the transparent electrode pattern covers a portion of the substrate, the transparent electrode pattern including a pixel electrode connected to the drain electrode, an upper gate pad electrode connected to the lower gate pad electrode, and an upper data pad electrode connected to the lower data pad electrode, and the passivation film pattern is stacked on the gate insulation pattern, the passivation film pattern and the gate insulation pattern covering a remaining portion of the substrate excluding the portion of the substrate covered by the transparent electrode pattern; shaping a lateral surface of the source/drain pattern exposed by the passivation film pattern to be further inclined, downward and outward, than the passivation film pattern; depositing a transparent material on the substrate having the photo-resist pattern formed thereon; and removing portions of the transparent electrode material on the photo-resist pattern, and the photo-resist pattern beneath, to form a transparent electrode pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 7B is a sectional view of the exemplary gate patterns formed on a lower substrate by the first mask process in accordance with the embodiment of the invention using a three mask process;

DETAILED DESCRIPTION OF THE PREFERRED EMBODIMENTS

Reference will now be made in detail to the preferred embodiments of the present invention, examples of which are illustrated in the accompanying drawings.

Figure 1:
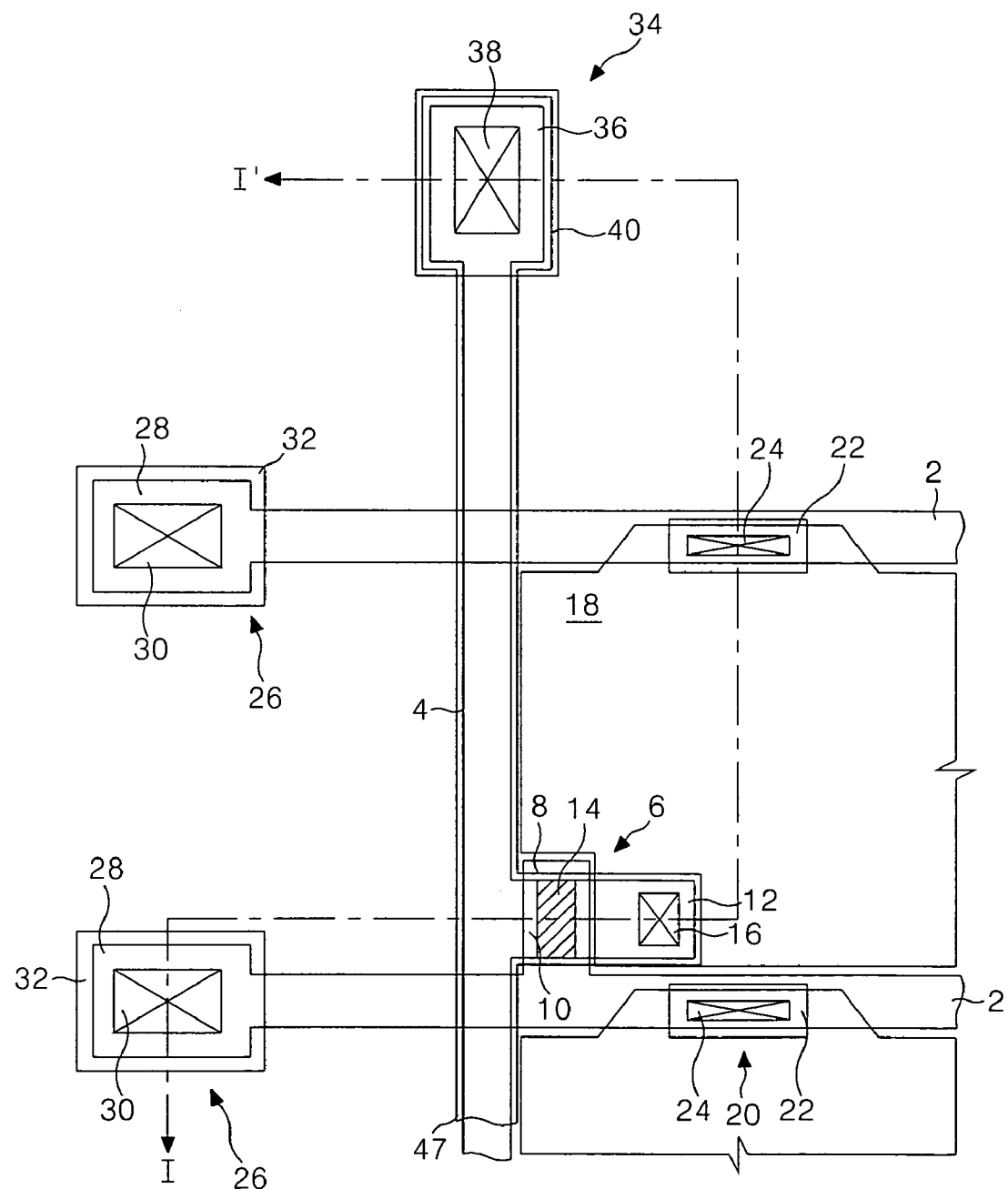
FIG. 1 is a plan view illustrating a portion of a thin film transistor array substrate in accordance with related art.
Figure 2:
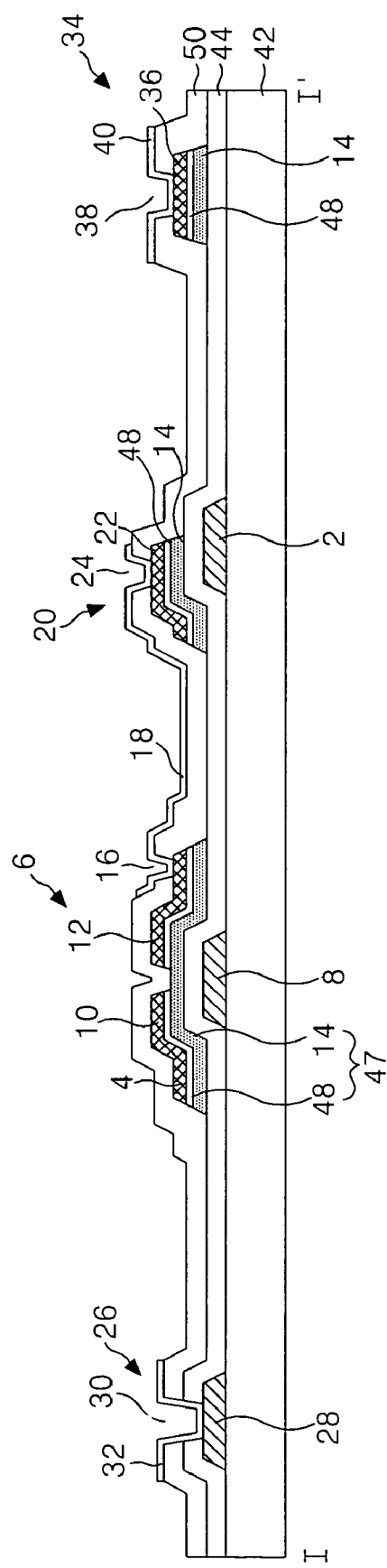
FIG. 2 is a sectional view of the related art thin film transistor array substrate taken along the line I–I' in FIG. 1.
Figure 3A:
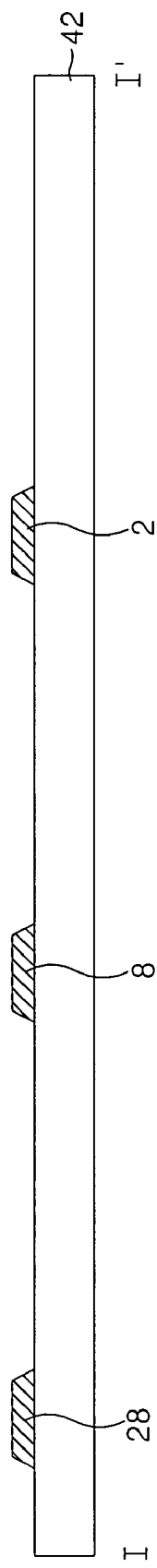
FIGS. 3A to 3D are sectional views sequentially illustrating a method of manufacturing the related art thin film transistor array substrate shown in FIG. 2.
Figure 3B:
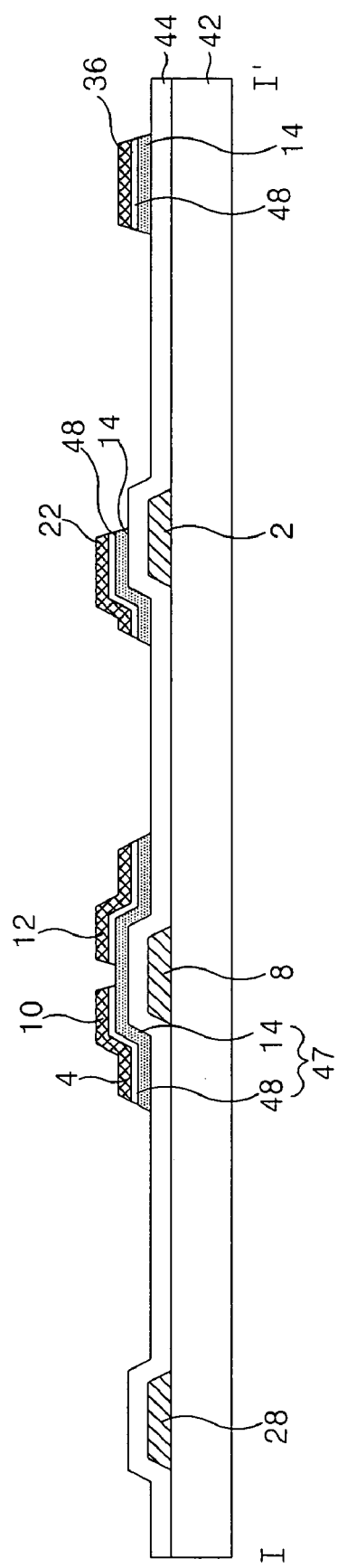
Figure 3C:
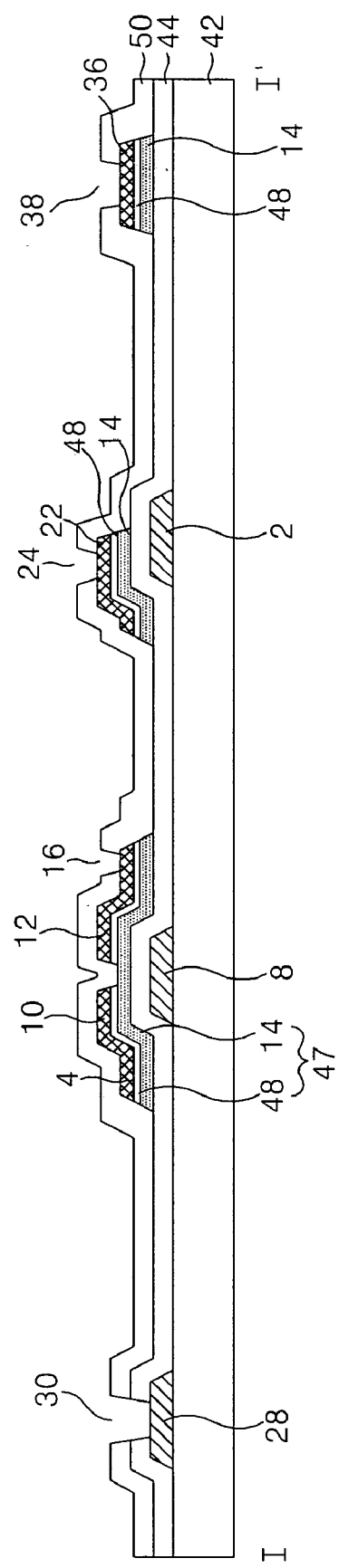
Figure 3D:
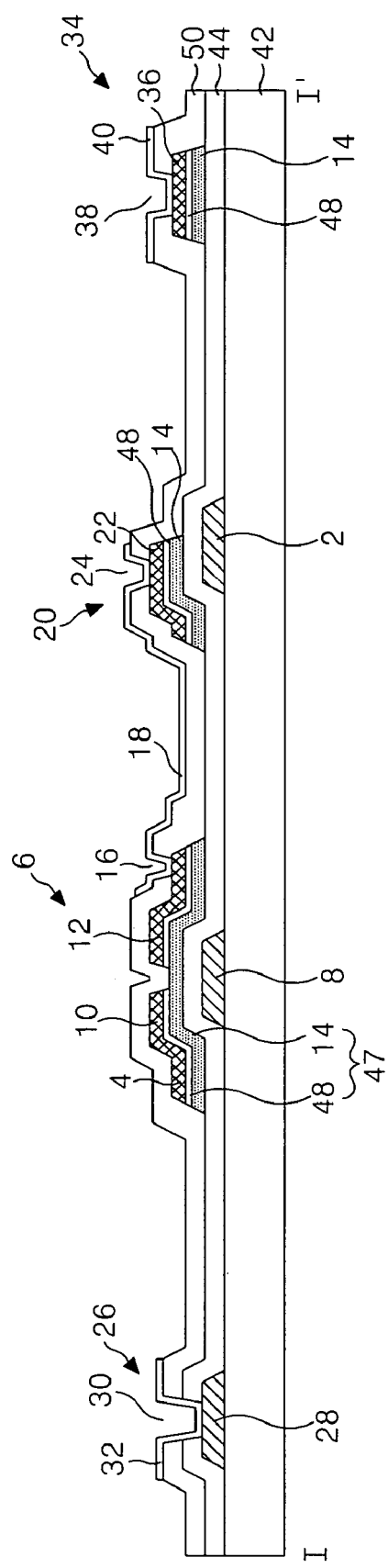
Figure 4:
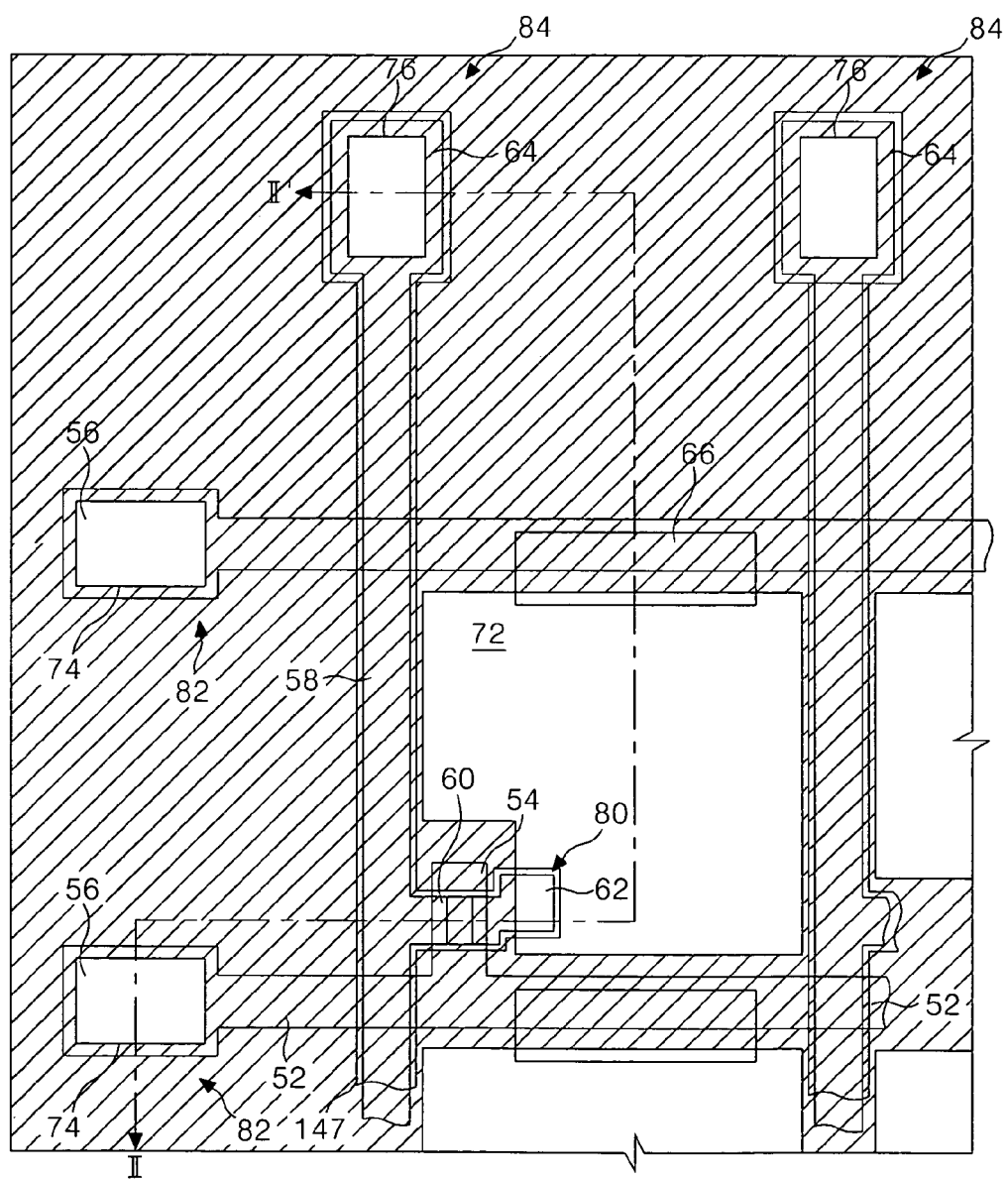
FIG. 4 is a plan view of an exemplary thin film transistor array substrate according to a first embodiment of the present invention.
Figure 5:
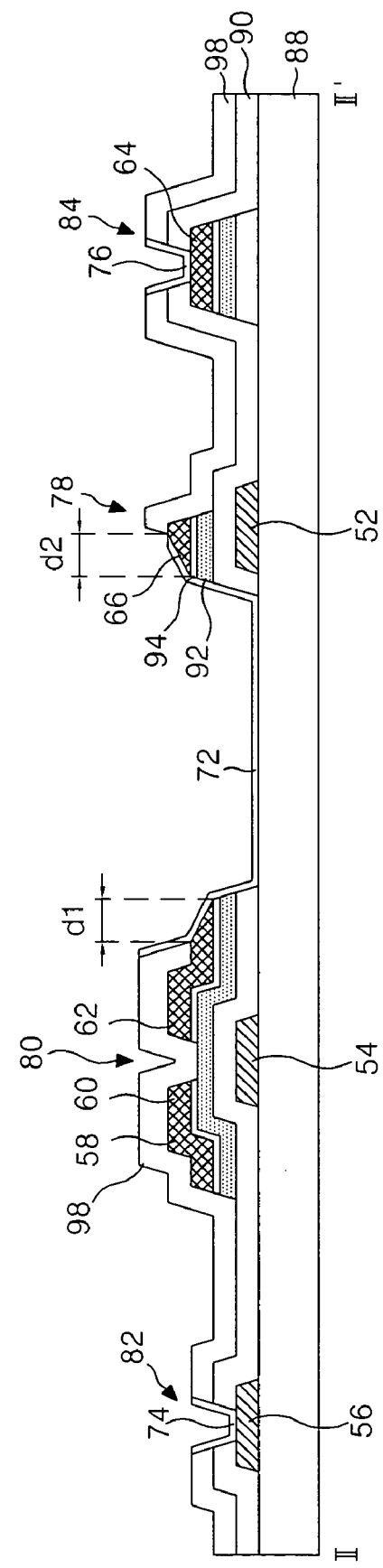
FIG. 5 is a sectional view of the exemplary thin film transistor array substrate taken along the line II–II' in FIG. 4.

FIG. 4 is a plan view of an exemplary thin film transistor array substrate according to a first embodiment of the present invention. FIG. 5 is a sectional view of the exemplary thin film transistor array substrate taken along the line II–II' in FIG. 4. Referring to FIGS. 4 and 5, the thin film transistor array substrate includes a gate line 52 and a data line 58 crossing each other. The thin film transistor also includes a gate insulating pattern 90 between the gate line 52 and the data line 58. The gate insulating pattern is formed on a lower substrate 88. A thin film transistor 80 is formed at a crossing of the gate line 52 and data line 58. A pixel electrode 72 is disposed in a pixel region defined by the crossing of the gate line 52 and the data line 58. The thin film transistor array substrate further includes a storage capacitor 78, a gate pad part 82, and a data pad part 84. The storage capacitor 78 is formed at an overlapped portion between a pre-stage gate line 52 and a storage electrode 66. The storage electrode 66 is connected to the pixel electrode 72. The gate pad part 82 is connected to the gate line 52. The data pad part 84 is connected to the data line 58.

The thin film transistor 80 includes a gate electrode 54, a source electrode 60, a drain electrode 62, and a semiconductor pattern 147. The gate electrode 54 is connected to the gate line 52. The source electrode 60 is connected to the data line 58. The drain electrode 62 is connected to the pixel electrode 72. The semiconductor pattern 147 includes an active layer 92 overlapping the gate electrode 54, with the gate insulating pattern 90 positioned therebetween, and forming a channel 70 between the source electrode 60 and the drain electrode 62. The thin film transistor 80 responds to a gate signal supplied to the gate line 52 to allow charging of the pixel electrode 72 and to maintain a pixel voltage signal supplied to the data line 58.

As discussed above in reference to FIGS. 4 and 5, the semiconductor pattern 147 includes the active layer 92. The active layer 92 includes the channel portion between the source electrode 60 and the drain electrode 62. The active layer 92 is overlapped with the source electrode 60, the drain electrode 62, the data line 58 and a lower data pad electrode 64. The active layer 92 is also overlapped with the storage electrode 66. Moreover, the active layer is formed to partially overlap the gate line 52 with the gate insulating pattern 90 positioned therebetween. The semiconductor pattern 147 further includes an ohmic contact layer 94 formed on the active layer 92 to establish an ohmic contact with the source electrode 60, the drain electrode 62, the storage electrode 66, the data line 58 and the lower data pad electrode 64.

The pixel electrode 72 is connected to the drain electrode 62 and the storage electrode 66 of the thin film transistor 80 externally exposed by a passivation film pattern 98. The pixel electrode 72 generates a potential difference with respect to a common electrode formed on an upper substrate (not shown) by a charged pixel voltage. Due to this potential difference, the liquid crystal material located between the thin film transistor substrate and the upper substrate rotates on account of a dielectric anisotropy. The rotated liquid crystal material transmits a light emitted by a light source (not shown) through the pixel electrode 72 to the upper substrate.

The storage capacitor 78 includes a pre-stage gate line 52 and the storage electrode 66. The storage electrode 66 is overlapped with a pre-stage gate line 52, with the gate insulating pattern 90, the active layer 92 and the ohmic contact layer 94 therebetween. The pixel electrode 72 is connected to the storage electrode 66 externally exposed by the passivation film pattern 98. The storage capacitor 78 is charged with the pixel voltage applied to the pixel electrode 72. The storage capacitor stabilizes the pixel voltage until a new pixel voltage is charged across the storage capacitor.

Still referring to FIGS. 4 and 5, the gate line 52 is connected to a gate driver (not shown) through the gate pad part 82. The data line 58 is connected to a data driver (not shown) through a data pad part (not shown). The gate pad part 82 includes a lower gate pad electrode 56 extending from the gate line 52 and an upper gate pad electrode 74 connected to the lower gate pad electrode 56.

The data line 58 is connected to a data driver (not shown) through a data pad part 84. The data pad part 84 includes a lower data pad electrode 64 extending from the data line 58 and an upper data pad electrode 76 connected to the lower data pad electrode 64. The data pad part 84 further includes the gate insulating pattern 90, the active layer 92 and the ohmic contact layer 94, which is formed between the lower data pad electrode 64 and the lower substrate 88. The gate insulating pattern 90 and the passivation film pattern 98 are formed in a region that excludes the pixel electrode 72, the upper gate pad electrode 74 and the upper data pad electrode 76.

Then, a source/drain pattern is formed. The source/drain pattern includes the source electrode 60, the drain electrode 62, the storage electrode 66 and the lower data pad electrode 64. The source/drain pattern can be made of molybdenum (Mo), molybdenum alloy or aluminum neodium (AlNd).

The source/drain pattern is then patterned by a dry-etching process using an etching gas containing sulfur hexa fluoride $SF_6$ and oxygen $O_2$. The dry-etching process avoids a disconnection of the pixel electrode caused by an undercut phenomenon of the source/drain pattern, which occurs when a wet etching is used. The undercut phenomenon results from a reaction of the source/drain pattern with the wet etching when the source/drain is made of chrome (Cr). In this instance, a passivation film 98, a semiconductor pattern and a gate insulating film 90 react with the dry-etching gas to form a passivation pattern 98. In contrast, the source/drain pattern does not react to the dry gas and, thus, is not patterned. The resulting source/drain pattern has a wider width than that of the semiconductor pattern and the gate insulating film 90. Accordingly, a disconnection is made between the transparent electrode patterns contacting with the source/drain pattern.

Figure 6:
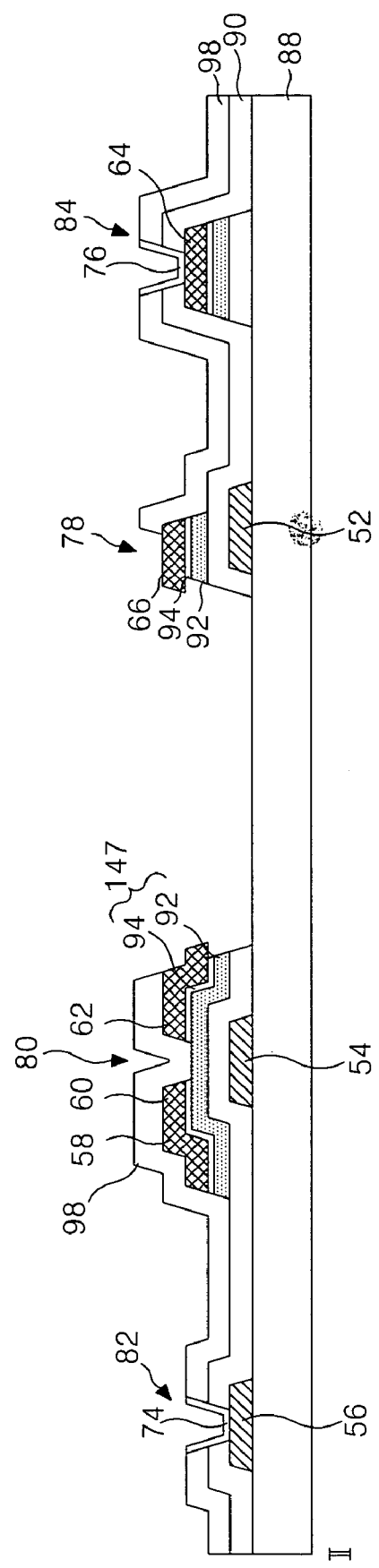
FIG. 6 is a sectional view of a disconnection of a pixel electrode due to an undercut phenomenon to be resolved with embodiments of the present invention.

FIG. 6 is a sectional view of a disconnection of a pixel electrode due to an undercut phenomenon to be resolved with embodiments of the present invention. As shown in FIG. 6, if an undercut is made at a lower portion of the drain electrode 62, the pixel electrode 72 is connected to the drain electrode 62, whereas the pixel electrode 72 is not electrically connected to the storage electrode 66. As a result, a pixel voltage cannot be normally charged in the capacitor 78.

In order to solve the above-mentioned problem, in embodiments of the present invention, a source/drain pattern is formed using a metal that can be etched by a dry etching to pattern the metal along with the semiconductor pattern, the gate insulating film 90a and the passivation film 98a during the formation of a passivation film pattern. At this stage, the source/drain pattern has a width similar to those of the semiconductor pattern, the gate insulating film 90a (shown for example in FIG. 8B) and the passivation film 98a (shown for example in FIG 10B). Then, the storage electrode 66 and the drain electrode 62 exposed by the passivation film pattern are formed to be further inclined, downward and outward, than a photo-resist pattern corresponding to the passivation film pattern. For example, a width of an inclined lateral region of the storage electrode 66 and a width of an inclined lateral region of the drain electrode 62 are about 0.1 µm to 1 µm each.

In embodiments of the present invention, the thin film transistor array substrate having such an arrangement is manufactured through the use of a three mask process. The three mask process includes a first mask process for forming the gate patterns, a second mask process for forming the semiconductor pattern and the source/drain pattern, and a third mask process for forming the gate insulating pattern 90, the passivation film pattern 98 and the transparent electrode pattern. An embodiment of the invention using the three mask process is discussed below in reference to FIGS. 7A to 10E.

Figure 7A:
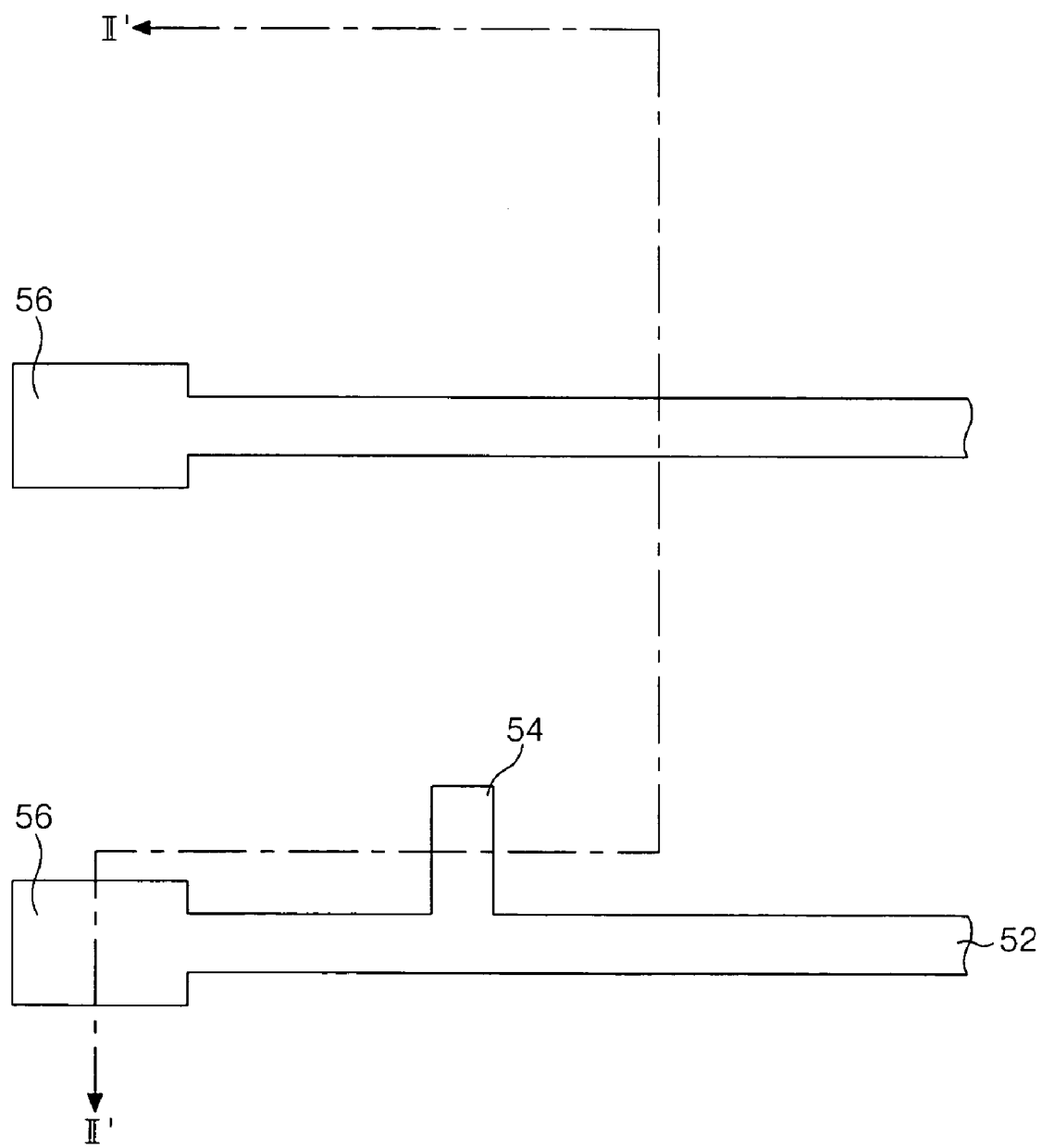
FIG. 7A is a plan view of exemplary gate patterns formed on a lower substrate by a first mask process in accordance with an embodiment of the invention using a three mask process.

FIG. 7A is a plan view of exemplary gate patterns formed on a lower substrate by a first mask process in accordance with an embodiment of the invention using a three mask process. FIG. 7B is a sectional view of the exemplary gate patterns formed on a lower substrate by the first mask process in accordance with the embodiment of the invention using a three mask process. In FIGS. 7A and 7B, a gate metal layer is formed by a deposition method, such as sputtering, on the lower substrate 88. The gate metal layer may be Cr, MoW, Cr/Al, Cu, Al(Nd), Mo/Al, Mo/Al(Nd), Cr/Al(Nd) or the like in a type of a single layer or a double layer structure. Subsequently, the gate metal layer is patterned by a photo-lithography process, using the first mask and an etching process, to form the gate patterns including the gate line 52 and the gate electrode 54.

Figure 8A:
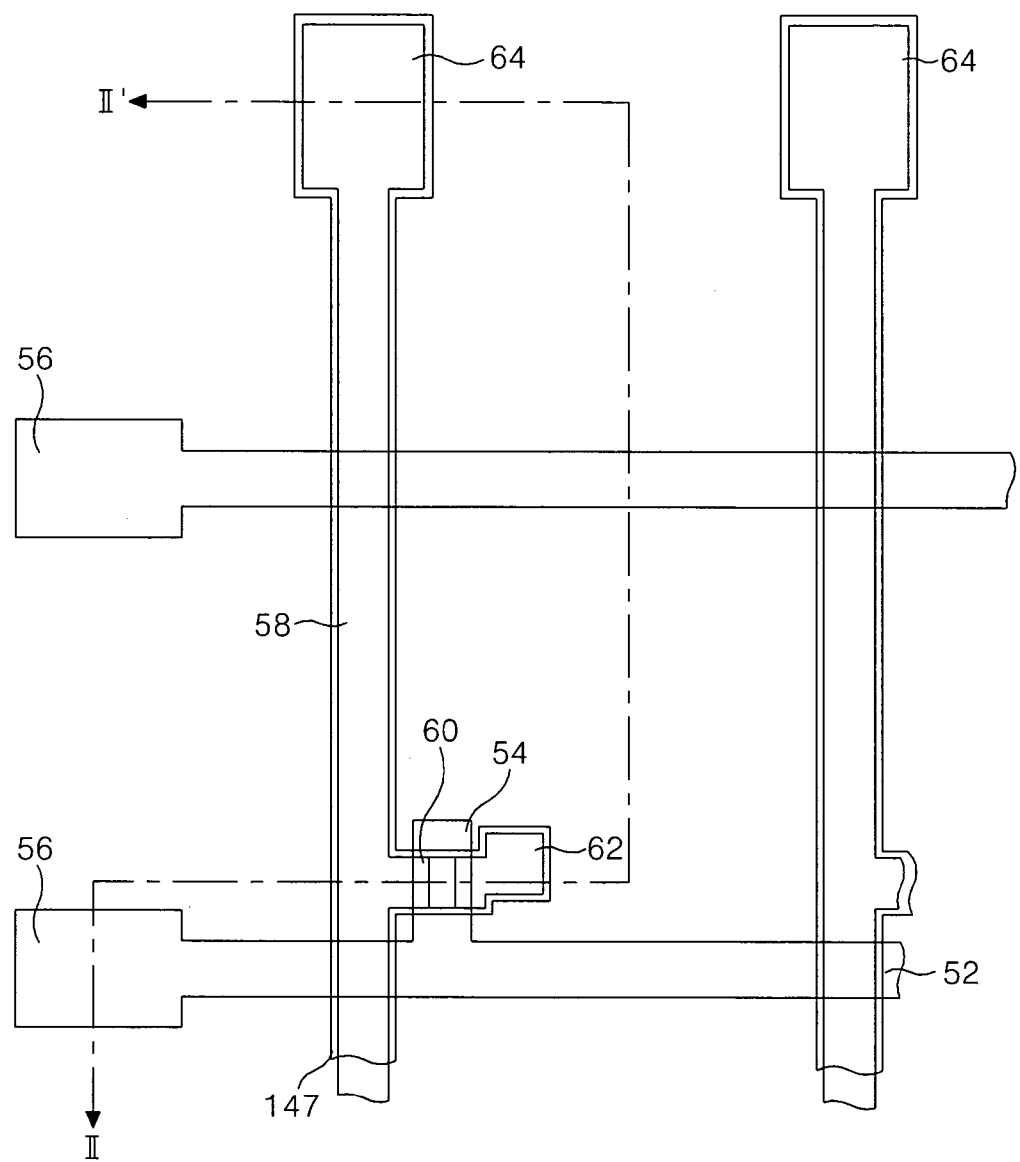
FIG. 8A is a plan view of an exemplary substrate including a source/drain pattern and a semiconductor pattern formed by a second mask process in accordance with the embodiment of the invention using a three mask process.
Figure 8B:
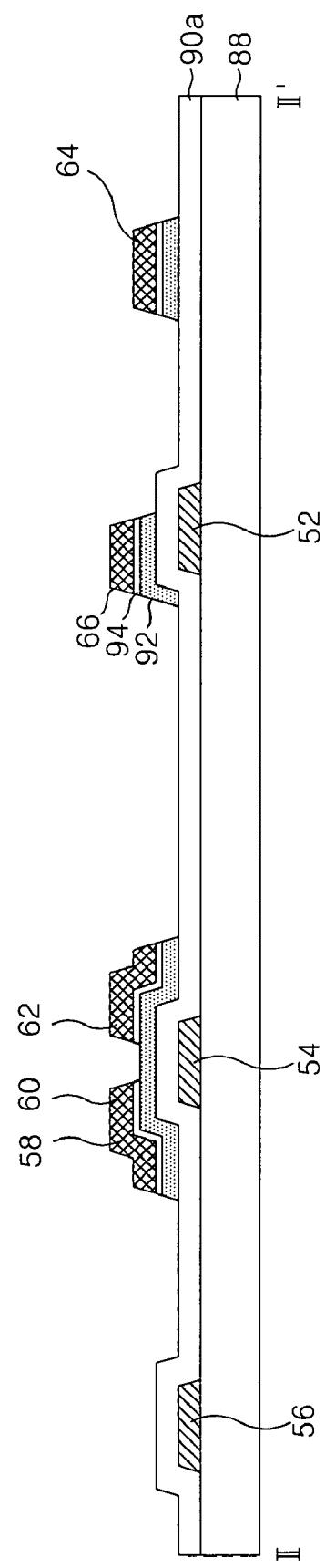
FIG. 8B is a sectional view of the exemplary substrate including a source/drain pattern and a semiconductor pattern formed by the second mask process in accordance with the embodiment of the invention using a three mask process.

FIG. 8A is a plan view of an exemplary substrate including a source/drain pattern and a semiconductor pattern formed by a second mask process in accordance with the embodiment of the invention using a three mask process. FIG. 8B is a sectional view of the exemplary substrate including a source/drain pattern and a semiconductor pattern formed by the second mask process in accordance with the embodiment of the invention using a three mask process. Referring to FIGS. 8A and 8B, a gate insulating layer 90a, an amorphous silicon layer, a n$^+$ amorphous silicon layer, and a source/drain metal layer are sequentially formed on the lower substrate 88 having the gate patterns. The gate insulating layer 90a is formed by a deposition technique, such as plasma enhanced chemical vapor deposition (PECVD) or sputtering. Herein, the gate insulating layer 90a is made of an inorganic insulating material, such as silicon oxide ($SiO_x$) or silicon nitride ($SiN_x$). The source/drain metal layer is made of molybdenum (Mo), molybdenum alloy or aluminum neodium (AlNd).

Figure 9A:
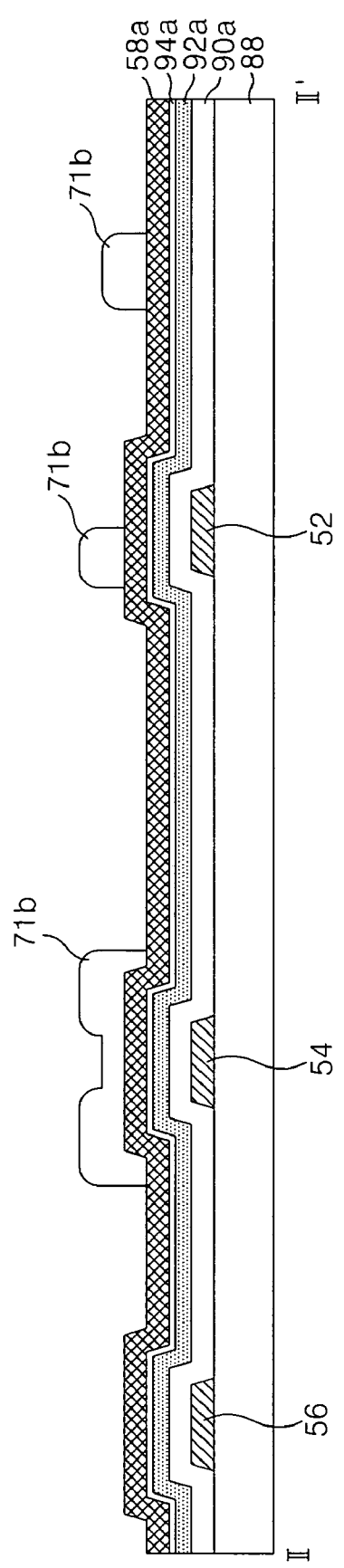
FIG. 9A illustrates the formation of a photo-resist pattern by an exemplary photolithography process using the second mask in accordance with the embodiment of the invention using a three mask process.

FIG. 9A illustrates the formation of a photo-resist pattern by an exemplary photolithography process using the second mask in accordance with the embodiment of the invention using a three mask process. Referring to FIG. 9A, a photo-resist pattern 71b is formed thereafter by a photolithography process using the second mask. In this case, a diffractive exposure mask having a diffractive exposing part is used as a second mask. The diffractive exposing part corresponds to a channel portion of the thin film transistor. As a result, the height of a photo-resist pattern in the channel portion is lower than that of a photo-resist pattern in the source/drain portion.

Figure 9B:
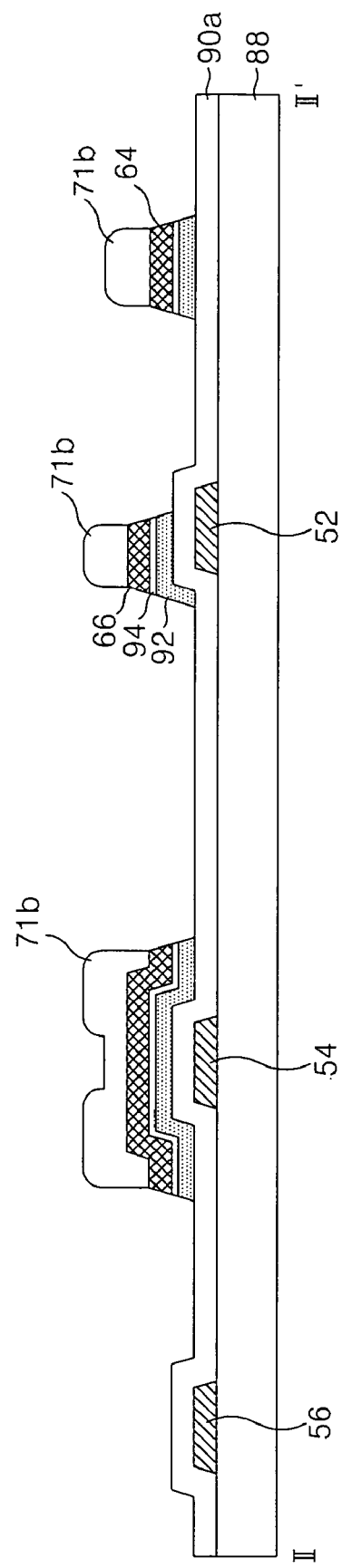
FIG. 9B illustrates an exemplary wet etching process for patterning a source/drain metal layer in accordance with the embodiment of the invention using a three mask process.

FIG. 9B illustrates an exemplary wet etching process for patterning a source/drain metal layer in accordance with the embodiment of the invention using a three mask process. Referring to FIG. 9B, the source/drain metal layer is subsequently patterned by a wet etching process using the photo-resist pattern 71b. The resulting source/drain patterns included the data line 58, the source electrode 60, the drain electrode 62 which is integral to the source electrode 60, and the storage electrode 66.

Figure 9C:
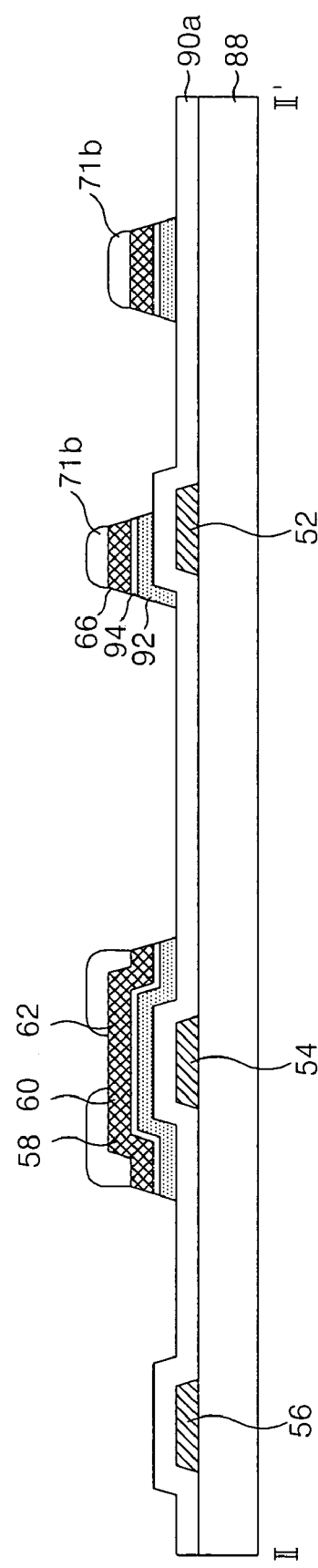
FIG. 9C illustrates an ashing process followed by a dry etching process for patterning a source/drain in a channel region in accordance with the embodiment of the invention using a three mask process.

FIG. 9C illustrates an ashing process followed by a dry etching process for patterning a source/drain in a channel region in accordance with the embodiment of the invention using a three mask process. Referring to FIG. 9C, the amorphous silicon layer and the n$^+$ amorphous silicon layer are simultaneously patterned by a dry etching process using the same photo-resist pattern 71b to thereby provide the ohmic contact layer 94 and the active layer 92. Also, as shown in FIG. 9C, the photo-resist pattern 71b having a relatively low height in the channel portion is removed by an ashing process.

Figure 9D:
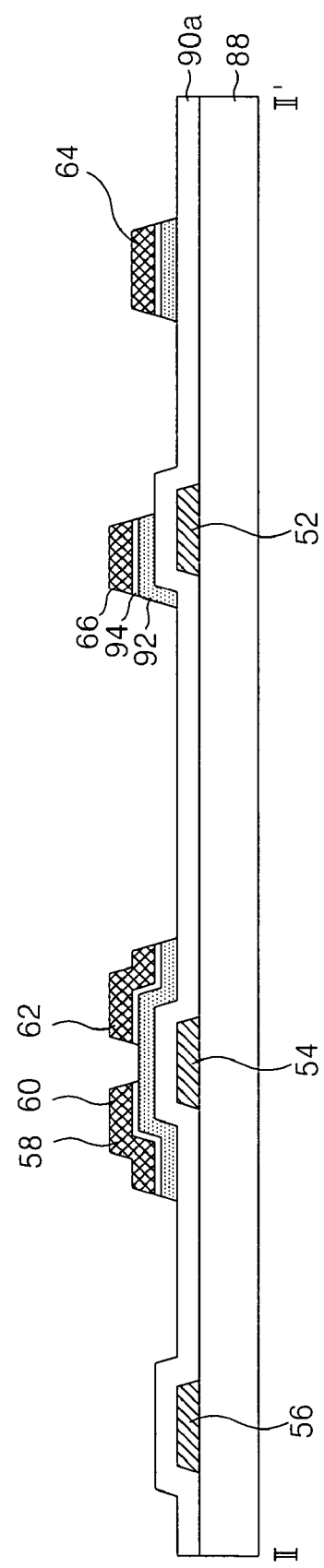
FIG. 9D illustrates an exemplary pattern of a source/drain in accordance with the embodiment of the invention using a three mask process.

FIG. 9D illustrates an exemplary pattern of a source/drain in accordance with the embodiment of the invention using a three mask process. Referring to FIG. 9D, The source/drain pattern and the ohmic contact layer 94 of the channel portion are thereafter etched by a dry etching process. The active layer 92 of the channel portion is exposed to separate the source electrode 60 from the drain electrode 62. Thereafter, a remainder of the photo-resist pattern left on the source/drain pattern part is removed using a stripping process.

Figure 10A:
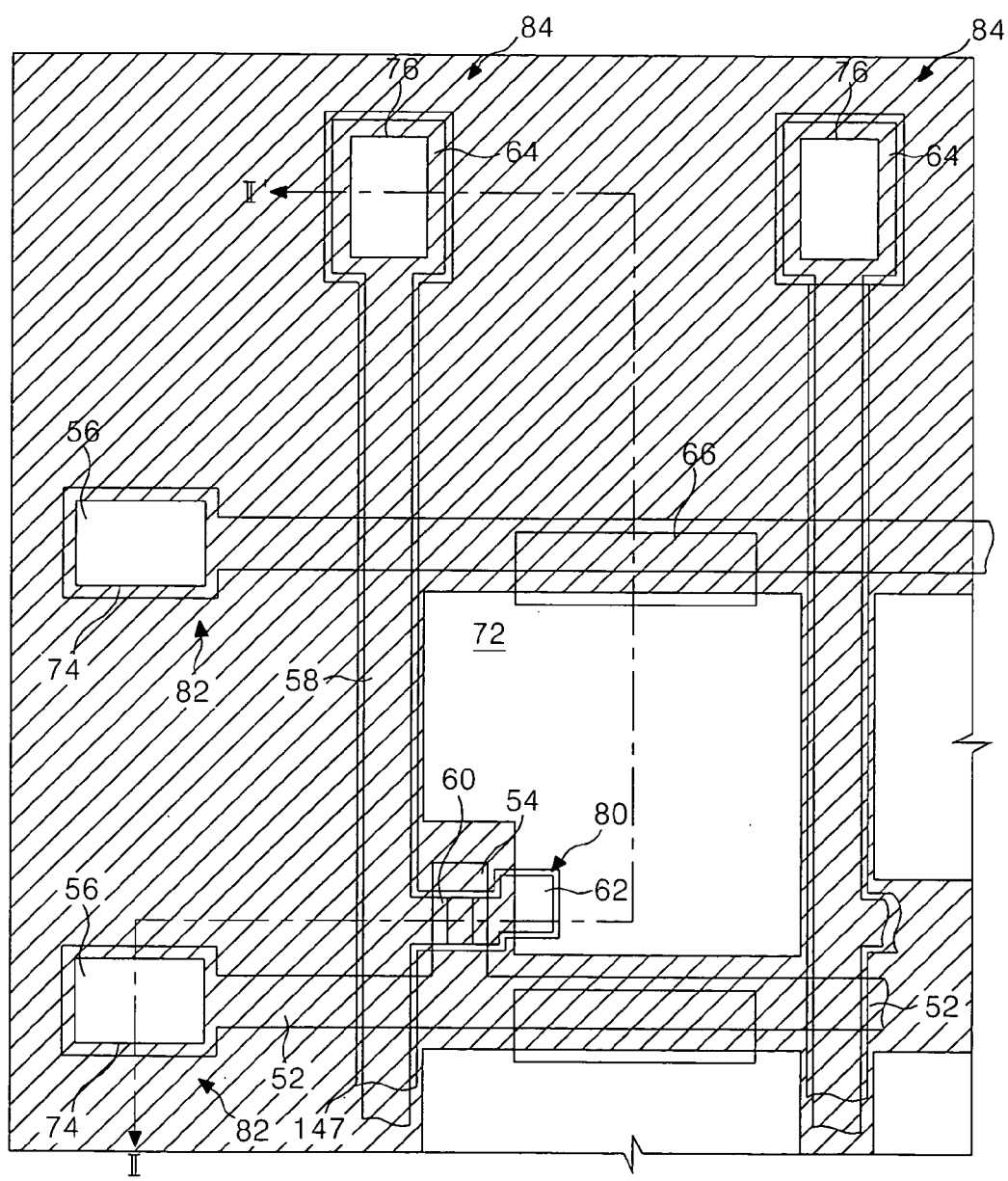
FIG. 10A is a plan view of a substrate including exemplary patterns formed by a third mask process in accordance with the embodiment of the invention using a three mask process.
Figure 10B:
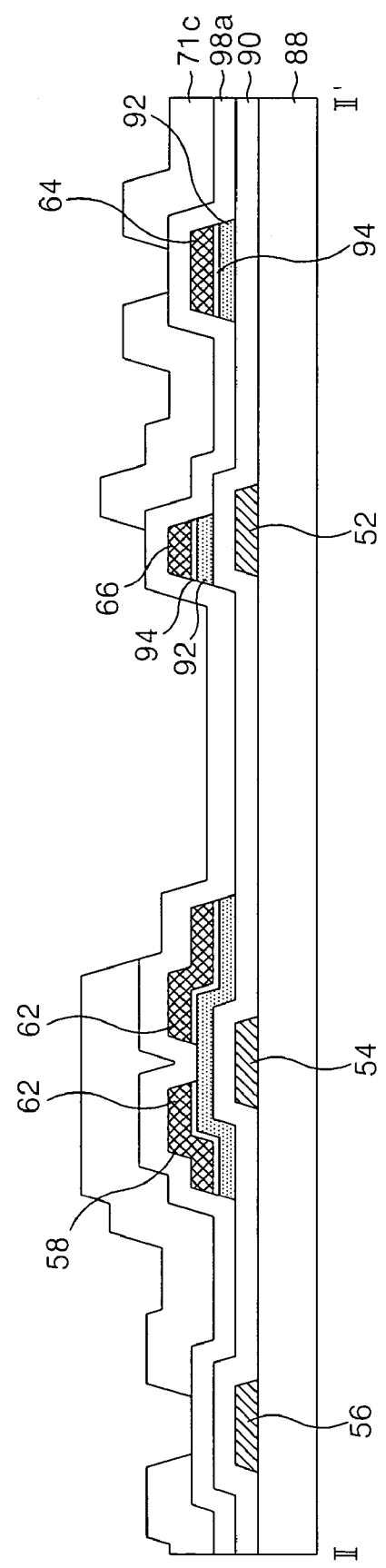
FIG. 10B is a sectional view of the substrate including the exemplary photo-resist pattern formed by a third mask process in accordance with the embodiment of the invention using a three mask process.

FIG. 10A is a plan view of a substrate including exemplary patterns formed by a third mask process in accordance with the embodiment of the invention using a three mask process. FIG. 10B is a sectional view of the substrate including the exemplary photo-resist pattern formed by a third mask process in accordance with the embodiment of the invention using a three mask process. Referring to FIG. 10B, a passivation film 98a is deposited by a deposition technique, such as sputtering, on the gate insulating film 90a having the source/drain patterns. The passivation film 98a can be made of an inorganic insulating material, such as silicon oxide ($SiO_x$) or silicon nitride ($SiN_x$). Alternatively, the passivation film can be made of an organic insulating material having a small dielectric constant, such as an acrylic organic compound, an organic insulating material, such as BCB (benzocyclobutene) or PFCB (perfluorocyclobutane). A photo-resist is applied over the entire passivation film 98a. Subsequently, a photo-resist pattern 71c is formed by a photolithography process using the third mask, as shown in FIG. 10B.

Figure 10C:
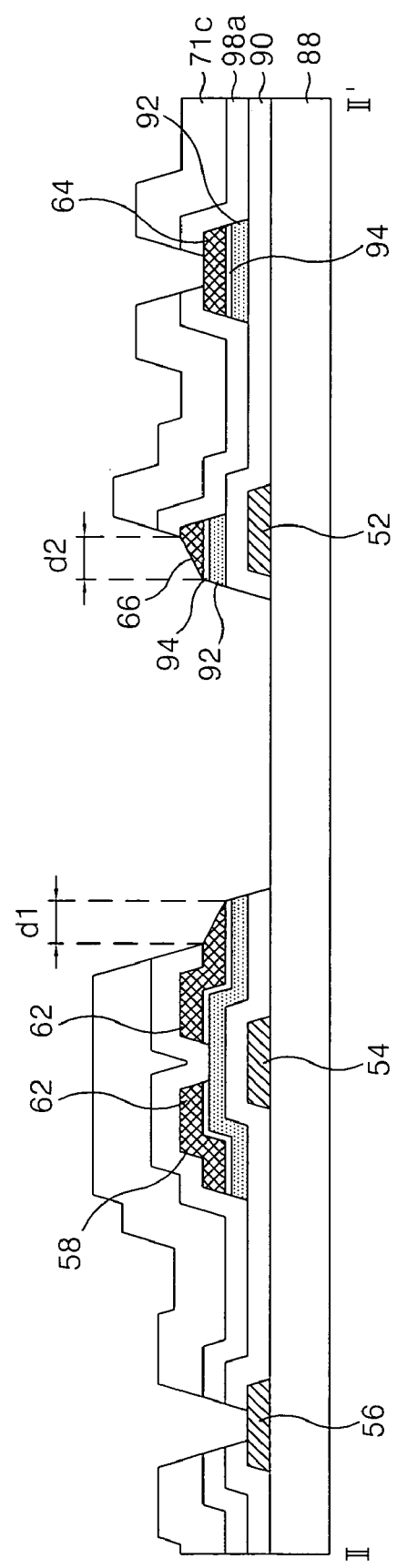
FIG. 10C is a sectional view illustrating an exemplary dry-etching process for patterning using a third mask process in accordance with the embodiment of the invention using a three mask process.

FIG. 10C is a sectional view illustrating an exemplary dry-etching process for patterning using a third mask process in accordance with the embodiment of the invention using a three mask process. Referring to FIG. 10C, the passivation film 98a and the gate insulating film 90 are subsequently patterned by a dry-etching process using the photo-resist pattern 71c as a mask to form a passivation film pattern 98 and the gate insulating pattern 90 at remaining areas excluding areas having a transparent electrode pattern within. Herein, an etching gas containing sulfur hexafluoride $SF_6$ and oxygen $O_2$ is used in the dry etching process. Thus, the drain electrode 62 of the thin film transistor, the storage electrode 66 and the semiconductor pattern between the gate insulating pattern 90 and the passivation film pattern 98 are etched. The resulting drain electrode 62 and the storage electrode 66 are further inclined, downward and outward, than a photo-resist pattern corresponding to the passivation film pattern 98. For instance, a width d1 of an inclined lateral region of the drain electrode 62 and a width d2 of an inclined lateral region of the storage electrode 66 are about 0.1 μm to 1 μm each.

Figure 11:
FIG. 11 is a photograph showing a drain electrode having an inclined lateral surface in an exemplary thin film transistor.

The metal used for the source/drain pattern includes a material, such as molybdenum (Mo), molybdenum alloy (Mo alloy) or aluminum neodium (AlNd), that can be etched by a dry-etching process. The drain electrode 62 is etched with the dry-etching process. The etched drain electrode 62 is inclined as depicted in the photograph shown in FIG. 11. Herein, a line width of the inclined portion is about 0.1 μm to 1 μm.

Figure 10D:
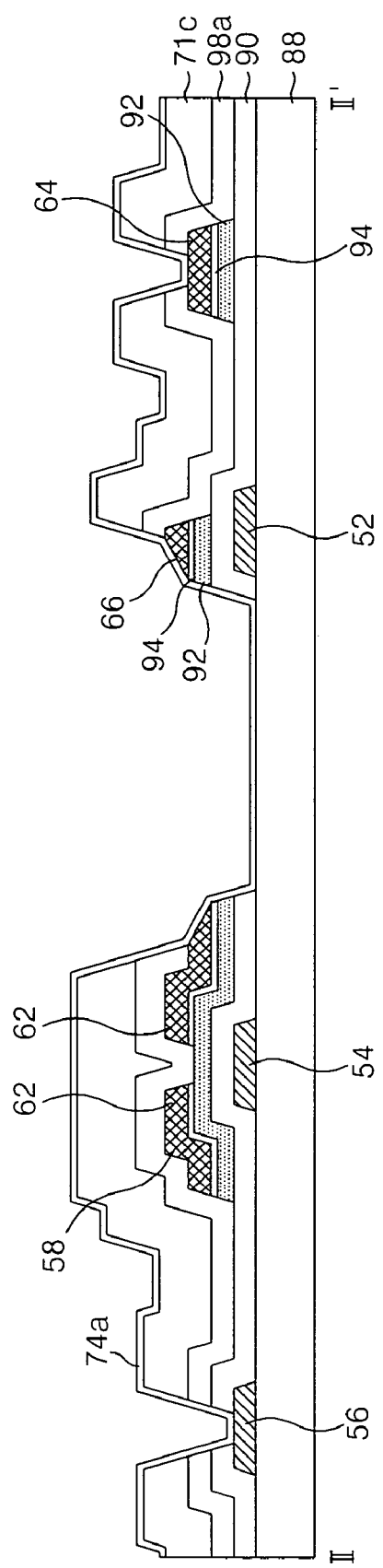
FIG. 10D is a sectional view illustrating the deposition of an electrode material using a third mask process in accordance with the embodiment of the invention using a three mask process.

FIG. 10D is a sectional view illustrating the deposition of an electrode material using a third mask process in accordance with the embodiment of the invention using a three mask process. Referring to FIG. 10D, a transparent electrode material 74a is thereafter deposited on the entire thin film transistor array substrate 88 having the photo-resist pattern 71c thereon. The transparent electrode is deposited by a deposition technique, such as sputtering. In this regard, the transparent electrode material is made of an indium-tin-oxide (ITO), a tin-oxide (TO) or an indium-zinc-oxide (IZO). The photo-resist pattern 71c is removed from the thin film transistor array substrate 88 having the transparent electrode material deposited thereon by a stripping process using a lift-off method.

Figure 10E:
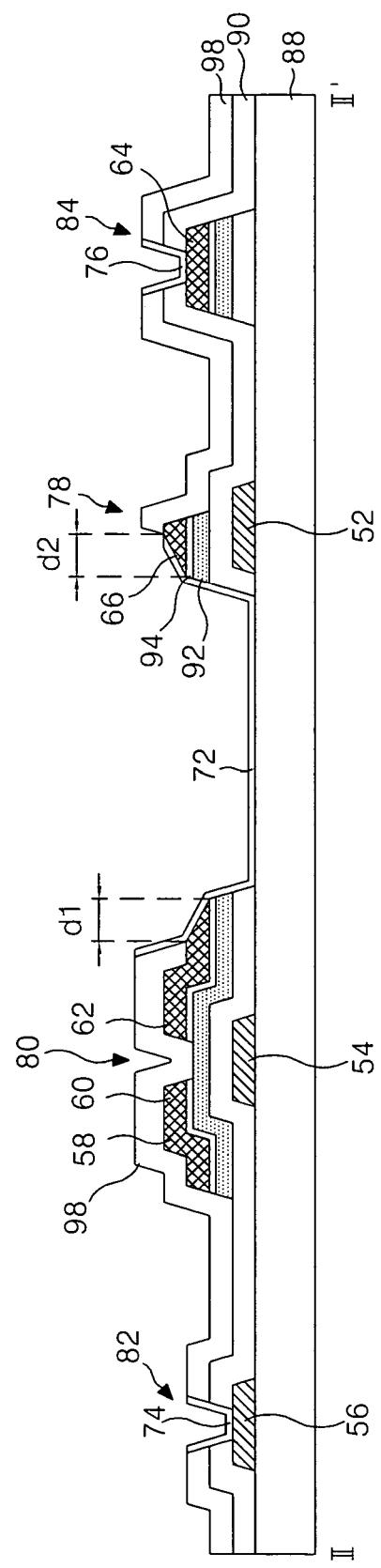
FIG. 10E is a sectional view illustrating the formation of a transparent electrode pattern using a third mask process in accordance with the embodiment of the invention using a three mask process.

FIG. 10E is a sectional view illustrating the formation of a transparent electrode pattern using a third mask process in accordance with the embodiment of the invention using a three mask process. Referring to FIG. 10E, the transparent electrode material 74a deposited on the photo-resist pattern 71c is removed together with the photo-resist pattern 71c to form a transparent pattern including the upper gate pad electrode 74, the pixel electrode 72 and the upper data pad electrode 76. The upper gate pad electrode 74 covers the lower gate pad electrode 56. The pixel electrode 72 is connected to the drain electrode 62 of the thin film transistor and the storage electrode 66 of the storage capacitor 78. The upper data pad electrode 76 is electrically connected to the lower data pad electrode 64.

As described above, in embodiments of the thin film transistor array substrate and the method of manufacturing the same, the configuration of the substrate, and the manufacturing process thereof, are simplified by the three mask process using the lift-off method. Accordingly, lower manufacturing cost and higher manufacturing yield can be achieved. Moreover, in embodiments of the thin film transistor array substrate and the method of manufacturing the same, the source/drain pattern employs a metal that can be etched by a dry etching. Accordingly, an undercut phenomenon, which otherwise occurs while patterning the gate insulating film and the passivation film, is avoided.

It will be apparent to those skilled in the art that various modifications and variations can be made in the thin film transistor array substrate, and the method of manufacturing the same, without departing from the spirit or scope of the invention. Thus, it is intended that the present invention cover the modifications and variations of this invention provided they come within the scope of the appended claims and their equivalents.

What is claimed is:

1. A thin film transistor array substrate, comprising:
    a gate pattern on a substrate, the gate pattern including a gate electrode of a thin film transistor, a gate line connected to the gate electrode, and a lower gate pad electrode connected to the gate line;
    a source/drain pattern including a source electrode and a drain electrode of the thin film transistor, a data line connected to the source electrode, and a lower data pad electrode connected to the data line;
    a semiconductor pattern formed beneath the source/drain pattern;
    a transparent electrode pattern including a pixel electrode connected to the drain electrode, an upper gate pad electrode connected to the lower gate pad electrode, and an upper data pad electrode connected to the lower data pad electrode; and
    a gate insulating pattern and a passivation film pattern stacked at remaining areas excluding areas within which the transparent electrode pattern is formed, wherein one end of the drain electrode has a flat surface and an inclined slope surface, an entire surface of the flat surface is covered with the passivation film pattern, and an entire surface of the inclined slope surface is covered with the pixel electrode.

2. The thin film transistor array substrate of claim 1, wherein the source/drain pattern includes at least one of molybdenum (Mo), molybdenum alloy (Mo alloy), and aluminum neodium (AlNd).

3. The thin film transistor array substrate of claim 1, further comprising a storage capacitor including the gate line and a storage electrode overlapping the gate line, with the gate insulating pattern and the semiconductor pattern positioned therebetween.

4. The thin film transistor array substrate of claim 3, wherein a lateral surface of the storage electrode is uncovered with respect to the passivation film pattern.

5. The thin film transistor array substrate of claim 1, wherein the inclined slope of the drain electrode at a lateral surface is formed over a horizontal dimension of about 0.1 μm to 1 μm.

* * * * *